United States Patent [19]

Tanaka

[11] Patent Number: 4,928,287
[45] Date of Patent: May 22, 1990

[54] AUTOMATIC EQUALIZER

[75] Inventor: Masato Tanaka, Tokyo, Japan

[73] Assignee: Sony Corporation, Tokyo, Japan

[21] Appl. No.: 318,001

[22] Filed: Mar. 2, 1989

[30] Foreign Application Priority Data

Mar. 10, 1988 [JP] Japan .................... 63-57004

[51] Int. Cl.$^5$ .............................. H04B 3/10
[52] U.S. Cl. ....................... 375/13; 360/32; 360/65; 375/14
[58] Field of Search ............. 375/12, 14, 106, 13; 333/18; 360/32, 65; 358/905, 167; 381/103

[56] References Cited

U.S. PATENT DOCUMENTS

| | | | |
|---|---|---|---|
| 4,128,848 | 12/1978 | Nakagawa | 358/905 |
| 4,389,623 | 6/1983 | Onishi et al. | 333/18 |
| 4,434,438 | 2/1984 | Rzeszewskt | 358/167 |
| 4,517,601 | 5/1985 | Yamada et al. | 358/905 |
| 4,674,103 | 6/1987 | Chevillat et al. | 375/13 |
| 4,849,989 | 7/1989 | Kamerman | 375/13 |

*Primary Examiner*—Benedict V. Safourek
*Attorney, Agent, or Firm*—Lewis H. Eslinger; Jay H. Maioli; Donald S. Dowden

[57] ABSTRACT

An automatic adaptive equalizer inspects either the input or output signal to the equalizer and extracts a predetermined specific waveform from such signal, analyses the extracted specific waveform based upon predetermined inspection parameters, and then controls the characteristics of the equalizer based upon the results of the analysis, thereby optimizing the equalizer characteristics.

12 Claims, 4 Drawing Sheets

FIG. IA

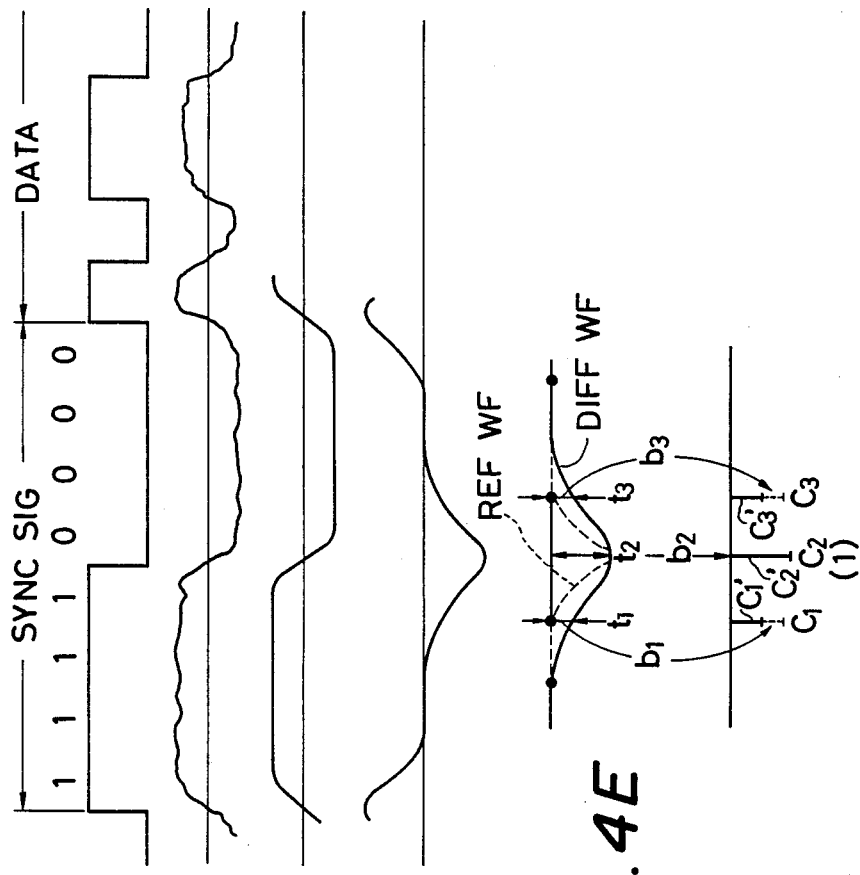

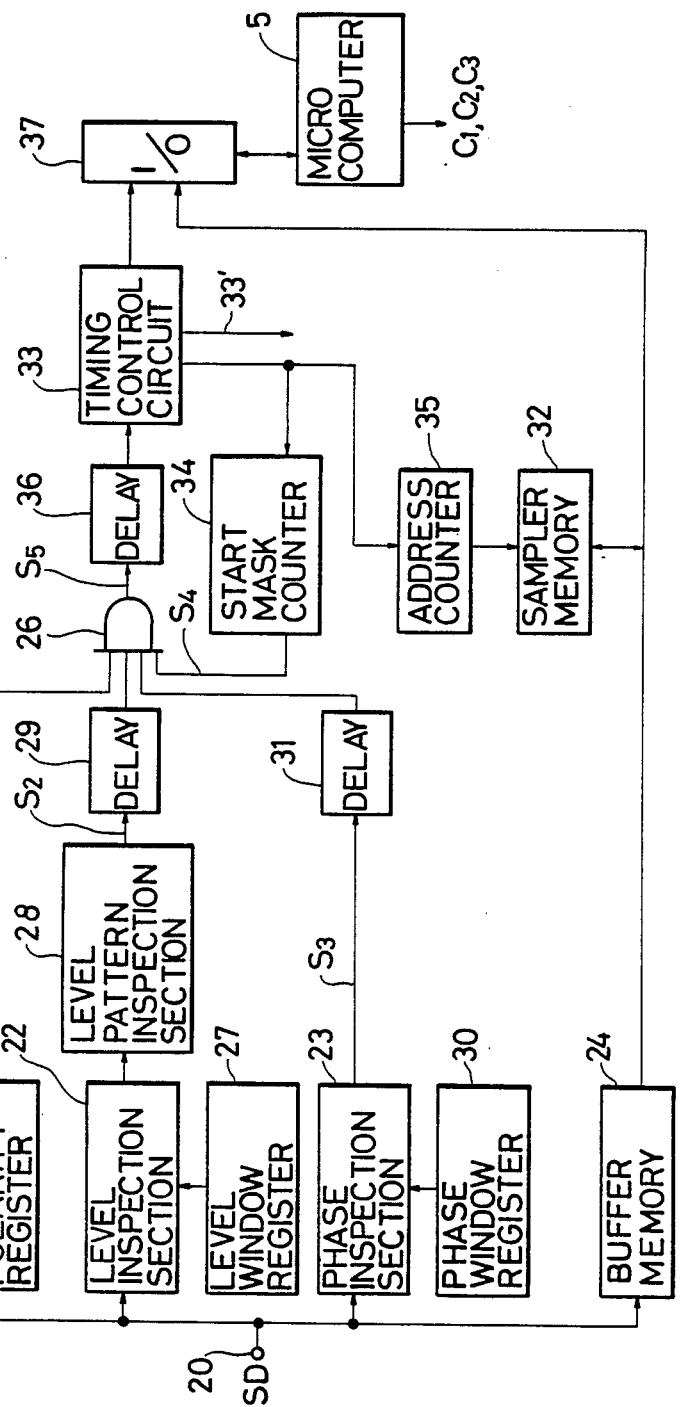

AUTOMATIC EQUALIZER

BACKGROUND OF THE INVENTION

1. Field of the Invention

This invention relates generally to an equalizer in which a coefficient is automatically controlled and, more particularly, to an automatically adaptive equalizer for use in a digital tape recorder or the like.

2. Description of the Background

In most known magnetic recording/reproducing apparatus, such as audio tape recorders, video tape recorders, or the like, the reproduced signal from the playback head is passed through an equalizer that has specifically selected frequency response characteristics. Generally, in such equalizers the high frequency range during playback is emphasized to compensate high-frequency signal loss caused by increased recording density. Typically, the frequency characteristics of this kind of equalizer are fixed once they are adjusted for the desired optimum performance. A problem arises, however, in that the frequency characteristics in the playback mode can change for various reasons. Among such reasons are the different types of tape being employed, tape aging, reproduction demagnetization, a change in spacing loss due to deterioration of the tape surface caused by repetitive playback and recording, variations in the characteristics of the head, a change in the rotary transformer caused by head wear, or a change in the gap dimension of the rotary transformer as a result of bearing wear, a variation in the azimuth angle of the playback and recording head from apparatus to apparatus, variations in the recording current, a change in the tape contact angle of the heads caused by a change in temperature or humidity, temperature characteristics, and overall aging of the electrical parts making up the circuitry of the tape recorder apparatus.

Therefore, even though many of the above changes in characteristics are generally minor, they do adversely affect the performance of the tape recorder so that the use of an equalizer that is permanently adjusted or fixed will not result in optimum performance or reliability. Furthermore, when the equalizer characteristics made to be adjustable within a particular tolerance band to take into consideration the variations in frequency characteristics caused by the various parameter changes described above, the recording density on the tape is adversely affected by this tolerance band.

Thus, elements whose values are adjustable are necessary for use, such as a potentiometer, a trimmer capacitor, or the like, in order to permit adjustment at the time of manufacture and for subsequent re-adjustment during maintenance procedures. The use of these additional parts increases the overall cost of the equipment and also results in higher labor costs and increases the overall bulk of the apparatus.

OBJECTS AND SUMMARY OF THE INVENTION

Accordingly, it is an object of the present invention to provide an apparatus for automatically equalizing a reproduced signal that can eliminate the above-noted defects inherent in the prior art.

Another object of this invention is to provide an equalizer that has characteristics that can be automatically adjusted to an optimum setting without regard to influences caused by variations in the circuit elements employed in the device.

In accordance with an aspect of the present invention, an inspection circuit is provided to examine or inspect the input or the output signal of the equalizer and an extraction circuit is provided to extract a specific waveform from that signal in response to the inspection circuit. The extracted waveform is then analyzed in a control circuit based upon a predetermined protocol and then the transfer characteristics of the equalizer are controlled based upon the results of this analysis.

According to another aspect of the present invention, the equalizer characteristics can be automatically adjusted so that manually adjustable parts such as a potentiometer, a trimmer capacitor, and the like and the steps that were previously employed to adjust these elements can be eliminated, thereby reducing the cost and overall size of the equalizer. This adaptive feature is accomplished in one embodiment by means of a microcomputer and because the equalizer is controlled by this microcomputer the state of the reproduced RF signal can be easily externally monitored, so that error detection and the like in both the manufacturing and maintenance procedures can be facilitated.

In keeping with the present invention because the equalizer characteristics need not be provided with tolerance limits or a margin in order to compensate the variation factors described above relative to a conventional equalizer, the equalizer characteristics can be continuously optimized, thereby leading to an increase in recording density.

The automatic equalizer of the present invention can also find utility as a ghost canceller, an echo canceller, or the like in a television receiver.

The above and other objects, features, and advantages of the present invention will become apparent from the following detailed description of illustrative embodiments thereof to be read in conjunction with the accompanying drawings, in which like reference numerals represent the same or similar elements.

BRIEF DESCRIPTION OF THE DRAWINGS

FIG. 1A is a schematic in block diagram form of an automatic equalizer according to an embodiment of the present invention;

FIGS. 4A–4E are waveform diagrams representing signal processing that occurs in the embodiments of FIGS. 1A and 1B; and FIG. 5 is a schematic in block diagram form showing the waveform sampler 4 employed in the circuit of FIGS. 1A, 1B and 3 in more detail.

DESCRIPTION OF PREFERRED EMBODIMENTS

Figure 2:
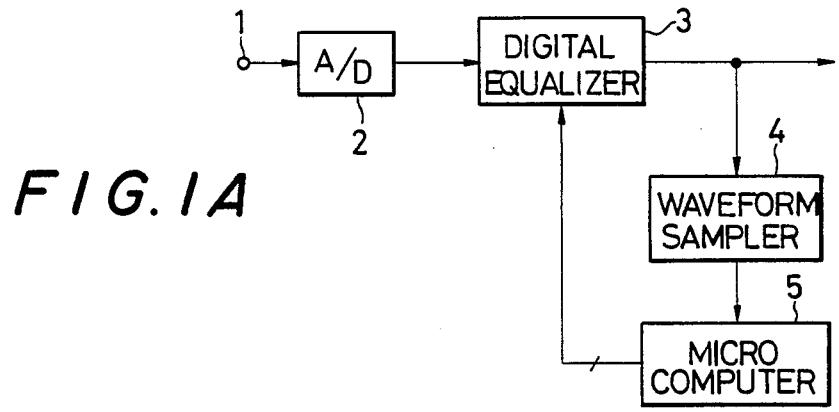
FIG. 2 is a schematic in block diagram form showing the digital equalizer used in the embodiments of FIGS. 1A and 1B in more detail.
Figure 2:
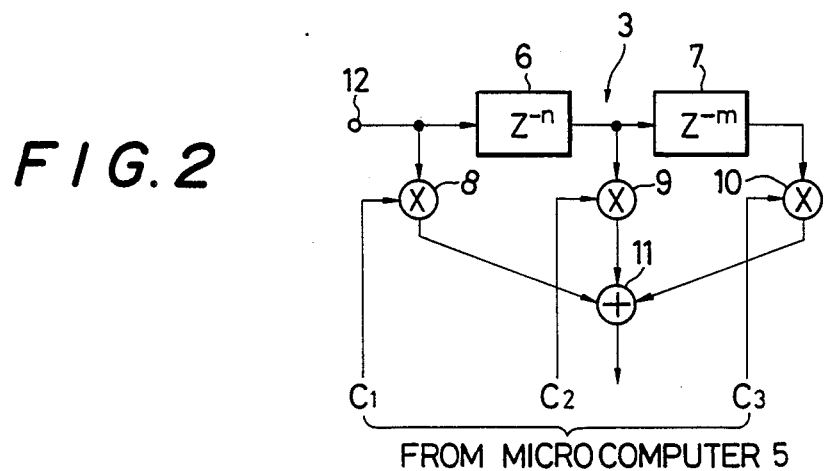

In FIG. 1A an RF signal reproduced from a record medium is fed from a playback head (not shown) to an input terminal 1 so that it can be converted to a digital signal by an analog-to-digital converter (A/D) 2. The reproduced digitized signal is passed through a digital equalizer 3 where it is corrected as desired, for example, the high-frequency range is emphasized and the equalized reproduced signal is then fed to the subsequent processing circuitry (not shown). The equalized reproduced signal is also fed to a waveform sampler circuit 4 that can detect a signal waveform having a predetermined pattern in the digital output of the digital equalizer 3. For example, if the subject equalizer is being employed in a digital audio tape recorder (DAT), the data block produced upon playback will include various signals, such as a sync signal, that have a predetermined code content. The waveform pattern of a sync signal is generally easy to detect, and it is that waveform that is detected in the embodiment of FIG. 1A. Waveform sampler 4 then supplies the characteristics of the waveform pattern, for example, a sync signal, to a microcomputer 5 where those characteristics are compared with the known characteristics of the predetermined waveform. Based upon this detection operation in microcomputer 5, the various equalization coefficients in the digital equalizer 3 can be adjusted accordingly. These coefficient adjustments typically take place in a digital circuit by changing the multiplication coefficients in respective multiplication circuits in the equalizer. In this fashion, the characteristics of the digital equalizer can be corrected or adapted to the received waveform, so that the optimum equalization is ultimately realized.

Figure 1B:
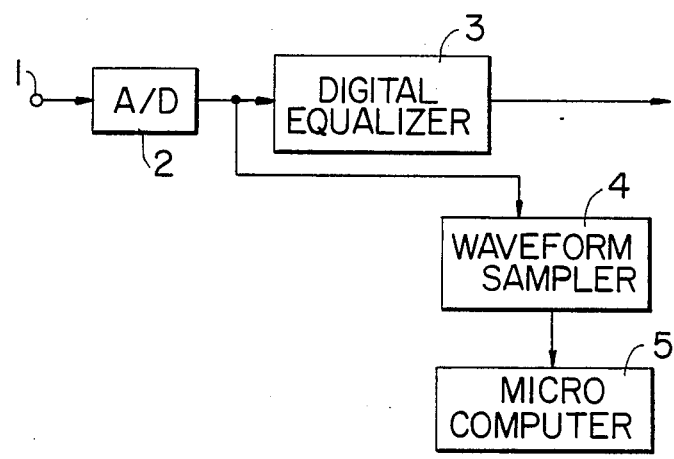
FIG. 1B is a schematic in block diagram form of an alternative to the embodiment of FIG. 1A.

The present invention also contemplates that waveform sampler 4 could be used to detect a predetermined waveform in the input signal to the digital equalizer, and this embodiment is represented in FIG. 1B by the line connecting the output of analog-to-digital converter 2 to the input of waveform sampler 4.

The digital equalizer 3 of FIGS. 1A and 1B is shown in more detail in FIG. 2, in which it is seen to comprise a nonrecursive filter known as a finite impulse response (FIR) digital filter that includes delay elements 6 and 7 that have respective unit delay times given by n and m times the sampling period, respectively. The input signal at terminal 12 is fed to a first digital multiplier 8, the output of delay circuit 6 is fed to a second digital multiplier 9, and the output of delay circuit 7 is fed to a third digital multiplier 10. Delay circuits 6 and 7 may simply comprise a three-tap delay line. Digital multipliers 8, 9, and 10 each receive a respective multiplication coefficient $C_1$, $C_2$, and $C_3$, and the outputs of the multipliers 8, 9, and 10 are fed to an adder circuit 11 where they are summed to produce the equalizer output.

In operation then, a digitally converted reproduced signal, as provided from an analog-to-digital converter, is fed in at input terminal 12 and is fed to multiplier 8 and also to delay circuit 6. Multiplier 8 also receives the multiplication coefficient $C_1$. The delayed digitized signal from delay circuit 6 is then fed to multiplier 9 and also to delay circuit 7, with multiplier 9 also receiving the multiplication coefficient $C_2$. The delayed output of delay circuit 7 is fed to multiplier 10 that also receives the multiplication coefficient $C_3$. The adjusted outputs from multipliers 8, 9, and 10 are then combined in adding circuit 11 whose output then forms the output signal of the digital equalizer 3. The values of multiplication coefficients $C_1$, $C_2$, and $C_3$ are calculated based on comparison results obtained in microcomputer 5 shown in the embodiment of FIGS. 1A and 1B.

Figure 3:
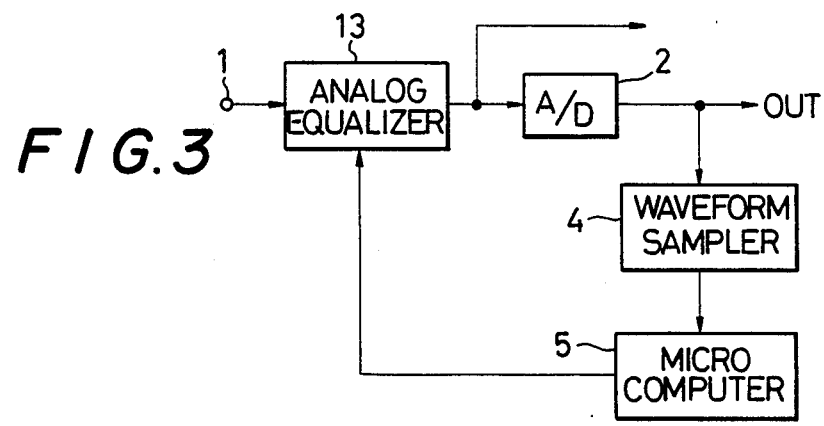
FIG. 3 is a schematic in block diagram form of an automatic equalizer according to another embodiment of the present invention.

Another embodiment of the present invention is shown in FIG. 3 in which an analog equalizer 13 is employed in place of the digital equalizer 3 of FIGS. 1A and 1B. This circuit provides an analog output as the output signal of analog equalizer 13 and also a digital output as the output signal of analog-to-digital converter 2. In any event, the same general procedure occurs in that waveform sampler 4 detects a specific pattern within the digital signal and the detected pattern characteristics are fed to a microcomputer where they are matched against the pattern and, based upon such match, the multiplication coefficients are then produced. In this case, the multiplication coefficients are fed to an analog equalizer 13, which may comprise a plurality of delay lines, variable amplifiers, or the like. It is the variable gains of such variable amplifiers that are controlled by the multiplication coefficients from microcomputer 5.

Operation of the waveform sampler 4 is explained utilizing the FIGS. 4A–4E that represent various waveforms that are operated upon in waveform sampler 4 and in microcomputer 5. As mentioned above, a waveform that is advantageous for use according to the present invention whose characteristics can be detected in waveform sampler 4 is a sync signal that is typically provided at the beginning of a data block of an information signal. Assuming that the sync signal is recorded on the tape as a 8-bit code that is a part of the recording signal, then the sync signal may assume the value "11110000", as represented in FIG. 4A. Assuming that it is this sync signal that is used, upon playback a waveform such as shown in FIG. 4B will be the waveform fed to waveform sampler 4. While only a single sync signal is shown in FIGS. 4A–4C, in actuality the sync signal waveform is detected from the reproduced waveform by waveform sampler 4 a number of times so that a plurality of detected sync signals can be averaged. This averaging results in obtaining a sync signal waveform from which the influence of noise or dropouts and the like can be effectively reduced.

This averaged or smoothed waveform is then represented in FIG. 4C. The detected sync signal waveform is then differentiated to provide a differentiated sync waveform as shown in FIG. 4D, and in microcomputer 5 the differentiated waveform is compared with a reference waveform. This comparison is represented in FIG. 4E in which the differentiated waveform is shown as a solid line and the reference waveform, as contained within microcomputer 5, is indicated by a dashed line. The reference waveform is generated based upon the recording signal, as shown in FIG. 4A, and specifically may be generated by providing a waveform that approximates the differentiated recording signal.

FIG. 4E graphically represents the comparison between the differentiated waveform of the playback signal as shown in FIG. 4D with the reference waveform that may be generated from the recording signal and, in that regard, the sampling points are represented at $t_1$, $t_2$, and $t_3$. Comparing the two waveforms at the three sampling points can result in differences represented graphically at $b_1$, $b_2$, and $b_3$. Based upon these detected differences, $b_1$, $b_2$, and $b_3$, the multiplication coefficients, $C_1$, $C_2$, and $C_3$, which are fed into multipliers 8, 9, 10, respectively, of FIG. 2 are calculated.

More particularly, assuming that the multiplication coefficients presently being employed in the digital equalizer 3 are represented as $C_1'$, $C_2'$, $C_3'$, the new multiplication coefficients $C_1$, $C_2$, and $C_3$, as represented in FIG. 4E can be given as:

$$C_1 = C_1' + kb_1 \tag{1}$$

$$C_2 = C_2'$$

$$C_3 = C_3' + kb_3 \qquad (2)$$

Therefore, the input signal is multiplied in multipliers 8, 9, and 10 of FIG. 2 by respective multiplication coefficients $C_1$, $C_2$, and $C_3$, thereby correcting the equalizer characteristics so that the differentiated waveform (FIG. 4D) approximates the reference waveform.

In this case, the delays $Z^{-n}$ and $Z^{-m}$ are respectively chosen as $Z^{-1}$ and, thus, such equal delays could be provided by a three-tap delay line. The constant k is the amplification or multiplication factor. In the embodiment of FIG. 3, which employs analog equalizer 13, it is the gains of variable amplifiers contained therein that are controlled by the signals that are generated by microcomputer 5 based upon the comparisons performed therein.

FIG. 5 represents an embodiment of the waveform sampler 4 used in the embodiments of FIGS. 1A, 1B and 3, in which the digital input signal SD obtained from analog-to-analog converter 2 or digital equalizer 3 is fed in at input terminal 20. This digital signal SD is fed to a pattern inspection section 21, a level inspection section 22, a phase inspection section 23, and a buffer memory 24.

In the pattern inspection section 21, the polarity of a sync signal waveform stored in a pattern register 25 is sequentially compared with the polarity of the input signal SD. When a coincidence between the patterns is found in inspection section 21, a positive detection signal $S_1$ is output and fed to an AND gate 26.

In level inspection section 22, the positive and negative levels of the input signal SD are sequentially compared with reference levels that are stored in a level window register 27. Level inspection section 22 operates to determine whether the positive or negative levels of the input signals SD exceed the predetermined levels contained within level window register 27. When the positive or negative level exceeds such predetermined levels, level inspection section 22 passes the actual signal SD to a level pattern inspection section 28. In level pattern inspection section 28, the signal SD is compared with positive and negative level patterns of the sync signal waveform that have been preset therein. When a coincidence is found between the signal SD and such positive and negative level patterns of the sync signal, level pattern inspection section 28 provides a positive detection signal $S_2$. The output of level pattern inspection section 28 is fed as the positive detection signal $S_2$ through delay circuit 29 to another input of AND gate 26. Delay circuit 29 is employed to adjust signal timing, in the well known manner.

Phase inspection section 23 sequentially inspects the input signal SD based upon the phase data stored in a phase window register 30 to determine whether any phase error of signal SD exceeds a predetermined range. If the phase error as determined by phase inspection 23 falls within the predetermined range, a positive output signal $S_3$ is provided that is fed through a delay circuit 31 to another input of AND gate 26. Again, delay circuit 31 is provided to adjust system timing.

In a sample phase inspection method, if it is assumed that the data to be inspected is given by a DATA(x) and the data after one clock period is given by DATA(x+1), and if DATA(x)+DATA(x+1) is equal to or smaller than the inspection reference value, then the detection signal $S_3$ is output.

The input digital signal SD at terminal 20 is fed into buffer memory 24 and is read out therefrom and written into a sampler memory 32 under control of an address counter 35.

A timing control circuit 33 provides the system timing and supplies a clock pulse signal of predetermined frequency to a start mask counter 34 and to address counter 35. Address counter 35 operates to control sampler memory 32 that is connected to receive and produce the signal on the line from buffer memory 24 to the input/output circuit (I/O) 37. Timing control circuit 33 also provides timing signals on line 33' for appropriate control of other circuits in the apparatus.

Start mask counter 34 has a count capacity that is determined by the length of a sync signal period, and when counter 34 counts clock pulses for a period equal to that sync signal period in an initial state, it then supplies a detection signal $S_4$ to another input of AND gate 26. Thus, in the initial state any insignificant data left remaining in the various inspection sections 21, 22, and 23 are invalidated, thereby preventing any such insignificant data from accidentally coinciding with the sync signal to thereby cause a detection error.

When AND gate 26 properly receives a coincidence of the several detection signals $S_1$, $S_2$, $S_3$, and $S_4$, it provides a sync signal waveform detection signal $S_5$ to timing control circuit 33 through a delay circuit 36. Delay circuit 36 is necessary to adjust the timing of the detection signal $S_5$. Upon receipt of this detection signal $S_5$ timing control circuit 33 provides a message to microcomputer 5 through I/O circuit 37 that indicates that a normal sync signal waveform has been detected. Microcomputer 5 then accepts the data from buffer memory 24 through I/O circuit 37 and performs the operations as represented in FIGS. 4C, 4D, and 4E based upon the read-out data and the reference waveform to thereby calculate the coefficients $C_1$, $C_2$, and $C_3$.

According to the embodiment described above, the predetermined waveform is detected based upon the polarity of the digital signal SD in the pattern inspection section 21 and is also detected based upon the level of the digital input signal SD in the level inspection section 22 and, further, is based upon the level pattern inspection section 28. Therefore, accurate detection can be achieved that is free from the adverse influences of noise or drop-outs. Because the digital signal SD that falls within a predetermined phase range is detected by phase inspection section 23, calculations can be facilitated while reducing the sampling time.

The above description is given on a single preferred embodiment of the invention, but it will be apparent that many modifications and variations could be effected by one skilled in the art without departing from the spirit or scope of the novel concepts of the invention, which should be determined by the appended claims.

What is claimed is:

1. An adaptive digital equalizer system in which equalizer characteristics are automatically controlled, the system comprising:
   a digital equalizer circuit having characteristics that are controllable by a plurality of equalization coefficients and producing an equalizer output signal;
   inspection means responsive to a predetermined pattern of the equalizer output signal for producing an inspection output signal;

extraction means responsive to the inspection output signal for extracting a specific waveform therefrom; and control means responsive to the extracted specific waveform for making an analysis of the extracted specific waveform in accordance with predetermined parameters thereof and modifying said equalization coefficients in accordance with said analysis, said equalization coefficients as modified being supplied to said digital equalizer circuit for controlling the characteristics of said digital equalizer circuit.

2. An adaptive equalizer system according to claim 1, wherein said inspection means comprises means for discriminating a polarity of the output signal of said equalizer circuit.

3. An adaptive equalizer system according to claim 1, wherein said inspection means comprises means for discriminating a level of the output signal of said equalizer circuit.

4. An automatic equalizer according to claim 1, wherein said inspection means comprises means for discriminating a phase of the output signal of said equalizer circuit.

5. An adaptive digital equalizer in which equalizer characteristics are automatically controlled, the system comprising:

a digital equalizer circuit responsive to an equalizer input signal, having characteristics that are controllable by a plurality of equalization coefficients, and producing an equalizer output signal;

inspection means responsive to a predetermined pattern of the equalizer input signal for producing an inspection output signal;

extraction means responsive to the inspection output signal for extracting a specific waveform therefrom; and control means responsive to the extracted specific waveform for making an analysis of the extracted specific waveform in accordance with predetermined characteristics thereof and modifying said equalization coefficients in accordance with said analysis, said equalization coefficients as modified being supplied to said digital equalizer circuit for controlling the characteristics of said digital equalizer circuit.

6. An adaptive equalizer according to claim 5, wherein said inspection means comprises means for discriminating a polarity of the input signal of the equalizer circuit.

7. An adaptive equalizer according to claim 5, wherein said inspection means comprises means for discriminating a level of the input signal of the equalizer circuit.

8. An automatic equalizer according to claim 5, wherein said inspection means comprises means for discriminating a phase of the input signal of the equalizer circuit.

9. An adaptive equalizer system in which digital input signal characteristics are automatically controlled, the system comprising:

an equalizer circuit having controllable signal transfer characteristics and producing an equalizer output signal;

inspection means responsive to a predetermined pattern of the equalizer output signal for producing an inspection output signal;

extraction means responsive to the inspection output signal for extracting a specific waveform therefrom; and control means responsive to the extracted specific waveform for making a comparison of the extracted specific waveform with a predetermined waveform pattern and controlling the signal transfer characteristics of said equalizer circuit based on the comparison result;

wherein said inspection means comprises at least one of means for discriminating a polarity of the output signal of the equalizer circuit, means for discriminating a level of the output signal of the equalizer circuit, and means for discriminating a phase of the output signal of the equalizer circuit.

10. An adaptive equalizer system according to claim 9, wherein a buffer memory stores the output signal from the equalizer circuit, a logic circuit receives an output form said means for discriminating a polarity, said means for discriminating a level, and said means for discriminating a phase for producing an output fed to said control means, whereby the signal stored in said buffer memory is compared with the predetermined waveform pattern.

11. An adaptive equalizer system according to claim 10, wherein a timing control means receives the output signal from said logic circuit and controls an address counter to cause a selected portion of the output signal stored in said buffer memory to be temporarily retained in a sample memory for transfer to said control means.

12. An adaptive equalizer system according to claim 9, wherein said means for discriminating a level includes a level inspection circuit for comparing the output signal from said equalization circuit with upper and lower predetermined levels fed from a level window register and upon said upper or lower level being exceeded, said output signal of said equalizer circuit being fed to a level pattern section for determining coincidence with a predetermined pattern contained therein.

* * * * *

UNITED STATES PATENT AND TRADEMARK OFFICE
CERTIFICATE OF CORRECTION

PATENT NO. : 4,928,287
DATED : May 22, 1990
INVENTOR(S) : Masato Tanaka

It is certified that error appears in the above-identified patent and that said Letters Patent is hereby corrected as shown below:

Col. 8, line 34, change "form" to --from--

Signed and Sealed this

Seventeenth Day of September, 1991

*Attest:*

HARRY F. MANBECK, JR.

*Attesting Officer*  *Commissioner of Patents and Trademarks*